United States Patent
Chae et al.

(10) Patent No.: US 9,230,740 B2
(45) Date of Patent: Jan. 5, 2016

(54) MULTILAYER CERAMIC ELECTRONIC PART TO BE EMBEDDED IN BOARD AND PRINTED CIRCUIT BOARD HAVING MULTILAYER CERAMIC ELECTRONIC PART EMBEDDED THEREIN

(71) Applicant: SAMSUNG ELECTRO-MECHANICS CO., LTD., Suwon, Gyunggi-do (KR)

(72) Inventors: Eun Hyuk Chae, Gyunggi-do (KR); Byoung Hwa Lee, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 0 days.

(21) Appl. No.: 14/067,734

(22) Filed: Oct. 30, 2013

(65) Prior Publication Data

US 2015/0021077 A1    Jan. 22, 2015

(30) Foreign Application Priority Data

Jul. 17, 2013    (KR) .................. 10-2013-0084042

(51) Int. Cl.
*H01G 4/005* (2006.01)
*H01G 4/30* (2006.01)
*H01G 4/008* (2006.01)
*H01G 2/06* (2006.01)
(Continued)

(52) U.S. Cl.
CPC . *H01G 4/30* (2013.01); *H01G 2/06* (2013.01); *H01G 4/008* (2013.01); *H05K 1/185* (2013.01); *H05K 3/0035* (2013.01); *H05K 2201/10015* (2013.01); *H05K 2201/10636* (2013.01)

(58) Field of Classification Search
USPC .......... 361/306.3, 321.1, 321.2, 321.3, 321.4, 361/320
See application file for complete search history.

(56) References Cited

U.S. PATENT DOCUMENTS 6,381,118 B1 *    4/2002    Yokoyama et al. ........ 361/308.1
2001/0055192 A1 *    12/2001    Nakano et al. ............. 361/306.3
(Continued)

FOREIGN PATENT DOCUMENTS

JP    2010-118499 A    5/2010
KR    10-2006-0047733 A    5/2006
(Continued)

OTHER PUBLICATIONS

Korean Office Action issued in Korean Application No. 10-2013-0084042 dated Jun. 24, 2014, w/English translation.

*Primary Examiner* — Steven T Sawyer
(74) *Attorney, Agent, or Firm* — McDermott Will & Emery LLP (57) ABSTRACT

There is provided a multilayer ceramic electronic part to be embedded in a board, including: a ceramic body including dielectric layers and having first and second main surfaces facing each other, first and second side surfaces facing each other, and first and second end surfaces facing each other; first and second internal electrodes; and first and second external electrodes formed on both end portions of the ceramic body, wherein the first external electrode includes a first base electrode and a first terminal electrode formed on a portion of the first base electrode formed on at least one of the first and second main surfaces of the ceramic body, the second external electrode includes a second base electrode and a second terminal electrode formed on a portion of the second base electrode formed on at least one of the first and second main surfaces of the ceramic body.

9 Claims, 4 Drawing Sheets

(51) Int. Cl.
*H05K 1/18* (2006.01)
*H05K 3/00* (2006.01)

(56) References Cited

U.S. PATENT DOCUMENTS

| 2002/0011351 | A1* | 1/2002 | Ogawa et al. ................. 174/260 |
| 2005/0248908 | A1 | 11/2005 | Dreezen et al. |
| 2006/0198079 | A1 | 9/2006 | Shim et al. |
| 2009/0002920 | A1* | 1/2009 | Itamura et al. ............. 361/321.3 |
| 2010/0118467 | A1* | 5/2010 | Takeuchi et al. ........... 361/306.3 |
| 2010/0290173 | A1* | 11/2010 | Yoon et al. ................. 361/321.2 |
| 2013/0020905 | A1* | 1/2013 | Sawada et al. ................ 310/311 |

FOREIGN PATENT DOCUMENTS

| KR | 10-2006-0098771 A | 9/2006 |
| KR | 10-2012-0085192 A | 7/2012 |

\* cited by examiner

MULTILAYER CERAMIC ELECTRONIC PART TO BE EMBEDDED IN BOARD AND PRINTED CIRCUIT BOARD HAVING MULTILAYER CERAMIC ELECTRONIC PART EMBEDDED THEREIN

CROSS-REFERENCE TO RELATED APPLICATION

This application claims the benefit of Korean Patent Application No. 10-2013-0084042 filed on Jul. 17, 2013, with the Korean Intellectual Property Office, the disclosure of which is incorporated herein by reference.

BACKGROUND OF THE INVENTION

1. Field of the Invention

The present invention relates to a multilayer ceramic electronic part to be embedded in a board and a printed circuit board having a multilayer ceramic electronic part embedded therein.

2. Description of the Related Art

As electronic circuits are highly dense and integrated, a mounting space for passive devices mounted on a printed circuit board may be insufficient. To solve this problem, an attempt to embed parts in the board, that is, to provide embedded devices, has been conducted. In particular, various methods of embedding a multilayer ceramic electronic part used as a capacitive part in a board have been proposed.

As methods of providing a multilayer ceramic electronic part within a board, there is provided a method of using a board material itself as a dielectric material for a multilayer ceramic electronic part and using copper wiring, or the like as an electrode for a multilayer ceramic electronic part. Further, as other methods of implementing an embedded multilayer ceramic electronic part, there are provided a method of forming an embedded multilayer ceramic electronic part by forming a high-K polymer sheet or a dielectric thin film in a board, a method of embedding a multilayer ceramic electronic part in a board, and the like.

Generally, a multilayer ceramic electronic part includes a plurality of dielectric layers formed of a ceramic material and internal electrodes inserted between the plurality of dielectric layers. Such a multilayer ceramic electronic part in the board is disposed within a board, thereby obtaining an embedded multilayer ceramic electronic part having high capacitance.

To manufacture a printed circuit board for a multilayer ceramic electronic part to be embedded therein, via holes need to be formed in an upper plate and a lower plate by using a laser, so as to connect board wirings to external electrodes of the multilayer ceramic electronic part after inserting the multilayer ceramic electronic part into a core board. Such laser processing is a factor in considerably increasing manufacturing costs of the printed circuit board.

Meanwhile, since the multilayer ceramic electronic part needs to be embedded in the core portion of the board, a nickel/tin (Ni/Sn) plating layer does not need to be formed on the external electrode, unlike in the case of a general multilayer ceramic electronic part mounted on a surface of a board.

That is, since the external electrode of the embedded multilayer ceramic electronic part is electrically connected to a circuit in the board through a via formed of copper (Cu), instead of through a nickel/tin (Si/Sn) layer, a copper (Cu) layer needs to be formed on the external electrode.

Generally, since even the external electrode is formed of copper (Cu) as a main component but also includes glass, the glass component absorbs the laser during laser processing for forming the via in the board, and thus, it may be difficult to adjust a depth of the via.

For this reason, such a copper (Cu) plating layer has been separately formed on the external electrode of the embedded multilayer ceramic electronic part.

However, due to the separately formed copper (Cu) plating layer, manufacturing costs may be increased, and due to the permeation of a plating solution, a problem in terms of reliability may still occur. Therefore, the above problems still need to be solved.

RELATED ART DOCUMENT

Patent Document (Patent Document 1) Korean Patent Laid-Open Publication No. 2006-0047733

SUMMARY OF THE INVENTION

An aspect of the present invention provides a multilayer ceramic electronic part to be embedded in a board and a printed circuit board having a multilayer ceramic electronic part embedded therein.

According to an aspect of the present invention, there is provided a multilayer ceramic electronic part to be embedded in a board, including: a ceramic body including dielectric layers and having first and second main surfaces facing each other, first and second side surfaces facing each other, and first and second end surfaces facing each other; first and second internal electrodes alternately exposed through the end surfaces of the ceramic body, having the dielectric layer disposed therebetween; and first and second external electrodes formed on both end portions of the ceramic body, wherein the first external electrode includes a first base electrode electrically connected to the first internal electrode and a first terminal electrode formed on a portion of the first base electrode formed on at least one of the first and second main surfaces of the ceramic body, the second external electrode includes a second base electrode electrically connected to the second internal electrode and a second terminal electrode formed on a portion of the second base electrode formed on at least one of the first and second main surfaces of the ceramic body, the first and second base electrodes are formed of a first conductive metal and glass, and the first and second terminal electrodes are formed of a second conductive metal.

The first and second terminal electrodes may be spaced apart from edges of the first and second base electrodes by a predetermined distance in a length direction of the ceramic body.

The first conductive metal may be at least one selected from a group consisting of copper (Cu), silver (Ag), nickel (Ni), and alloys thereof.

The second conductive metal may be copper (Cu).

According to another aspect of the present invention, there is provided a multilayer ceramic electronic part to be embedded in a board, including: a ceramic body including dielectric layers and having first and second main surfaces facing each other, first and second side surfaces facing each other, and first and second end surfaces facing each other; first and second internal electrodes laminated in the ceramic body with the dielectric layer disposed therebetween, being spaced apart from the end surfaces of the ceramic body by a predetermined distance, and having a lead exposed to at least one of the first and second side surfaces of the ceramic body; and first and second external electrodes formed on both end portions of the ceramic body, wherein the first external electrode includes a first base electrode electrically connected to the first internal electrode and a first terminal electrode formed on a portion of the first base electrode formed on at least one of the first and second main surfaces of the ceramic body, the second external electrode includes a second base electrode electrically connected to the second internal electrode and a second terminal electrode formed on a portion of the second base electrode formed on at least one of the first and second main surfaces of the ceramic body, the first and second base electrodes are formed of a first conductive metal and glass, and the first and second terminal electrodes are formed of a second conductive metal.

The first and second terminal electrodes may be spaced apart from edges of the first and second base electrodes by a predetermined distance in a length direction of the ceramic body.

The first conductive metal may be at least one selected from a group consisting of copper (Cu), silver (Ag), nickel (Ni), and alloys thereof.

The second conductive metal may be copper (Cu).

According to another aspect of the present invention, there is provided a printed circuit board having a multilayer ceramic electronic part embedded therein, the printed circuit board including: an insulating substrate; and the multilayer ceramic electronic part including a ceramic body including dielectric layers and having first and second main surfaces facing each other, first and second side surfaces facing each other and first and second end surfaces facing each other, first and second internal electrodes alternately exposed through both end surfaces of the ceramic body, having the dielectric layer disposed therebetween, and first and second external electrodes formed on both end portions of the ceramic body, wherein the first external electrode includes a first base electrode electrically connected to the first internal electrode and a first terminal electrode formed on a portion of the first base electrode formed on at least one of the first and second main surfaces of the ceramic body, the second external electrode includes a second base electrode electrically connected to the second internal electrode and a second terminal electrode formed on a portion of the second base electrode formed on at least one of the first and second main surfaces of the ceramic body, the first and second base electrodes are formed of a first conductive metal and glass, and the first and second terminal electrodes are formed of a second conductive metal.

The first and second terminal electrodes may be spaced apart from edges of the first and second base electrodes by a predetermined distance in a length direction of the ceramic body.

The first conductive metal may be at least one selected from a group consisting of copper (Cu), silver (Ag), nickel (Ni), and alloys thereof.

The second conductive metal may be copper (Cu).

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings.

The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Figure 1:
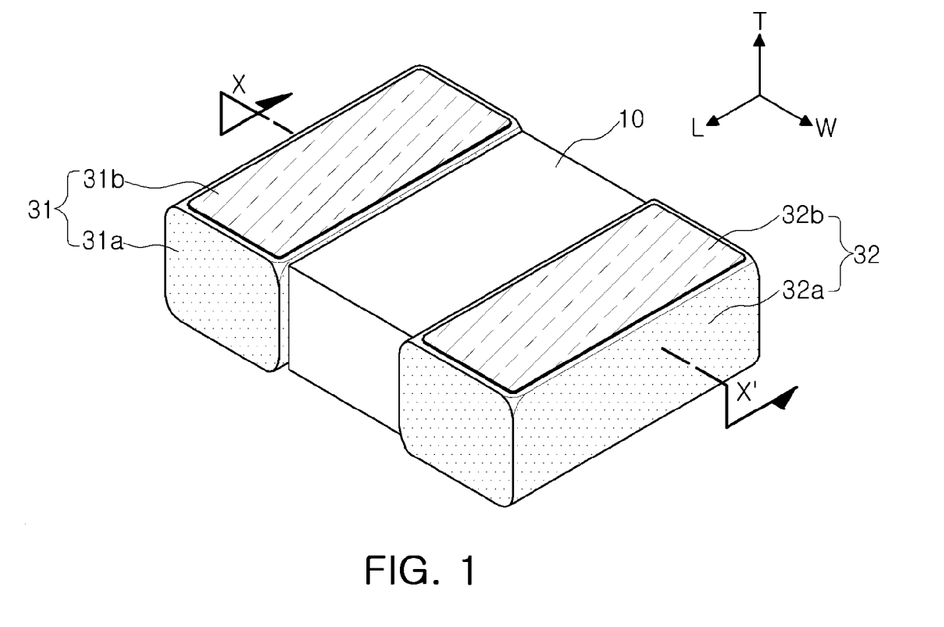
FIG. 1 is a perspective view illustrating a multilayer ceramic electronic part to be embedded in a board according to an embodiment of the present invention.

FIG. 1 is a perspective view illustrating a multilayer ceramic electronic part embedded in a board according to an embodiment of the present invention.

Figure 2:
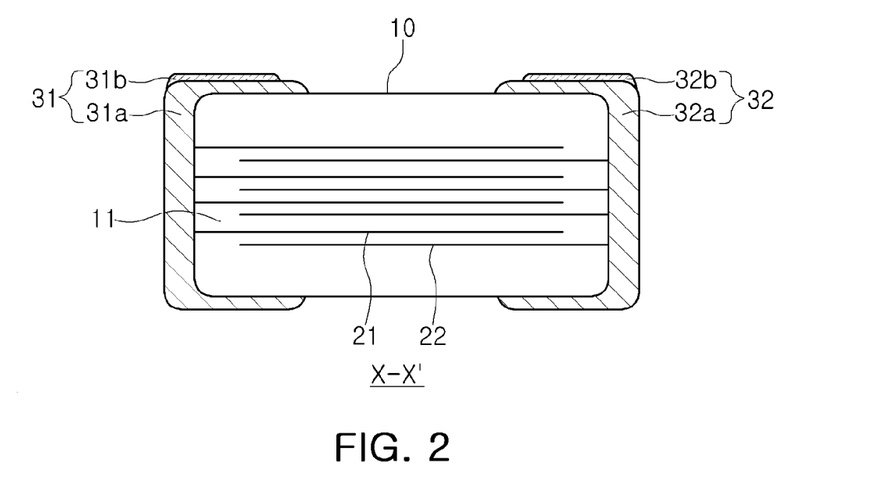
FIG. 2 is a cross-sectional view taken along line X-X' of FIG. 1.

FIG. 2 is a cross-sectional view taken along line X-X' of FIG. 1.

Figure 3:
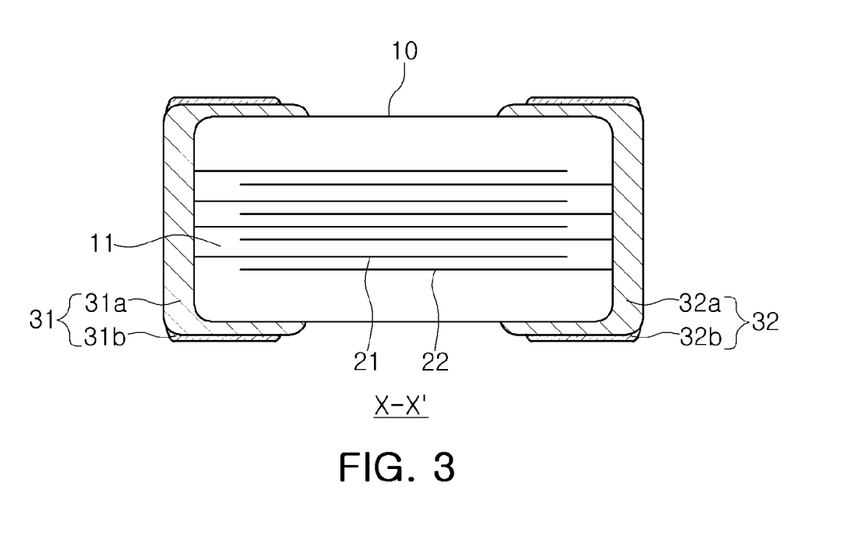
FIG. 3 is a cross-sectional view taken along line X-X' of FIG. 1 according to another embodiment of the present invention.

FIG. 3 is a cross-sectional view taken along line X-X' of FIG. 1 according to another embodiment of the present invention.

Referring to FIGS. 1 and 2, a multilayer ceramic electronic part embedded in a board according to an embodiment of the present invention may include: a ceramic body 10 including dielectric layers 11 and having first and second main surfaces facing each other, first and second side surfaces facing each other, and first and second end surfaces facing each other; first and second internal electrodes 21 and 22 alternately exposed through the end surfaces of the ceramic body 10, having the dielectric layer 11 disposed therebetween; and first and second external electrodes 31 and 32 formed on both end portions of the ceramic body 10, in which the first external electrode 31 includes a first base electrode 31a electrically connected to the first internal electrode 21 and a first terminal electrode 31b formed on a portion of the first base electrode 31a formed on at least one of the first and second main surfaces of the ceramic body 10, the second external electrode 32 includes a second base electrode 32a electrically connected to the second internal electrode 22 and a second terminal electrode 32b formed on a portion of the second base electrode 32a formed on at least one of the first and second main surfaces of the ceramic body 10, the first and second base electrodes 31a and 32a are formed of a first conductive metal and glass, and the first and second terminal electrodes 31b and 32b are formed of a second conductive metal.

Hereinafter, the multilayer ceramic electronic part according to the embodiment of the present invention will be described by taking a multilayer ceramic capacitor by way of example, but the invention is not limited thereto.

In the multilayer ceramic capacitor according to the embodiment of the present invention, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' is the same as a direction in which dielectric layers are laminated, that is, a 'lamination direction'.

According to the embodiment of the invention, a shape of the ceramic body 10 is not particularly limited, but may be hexahedral as illustrated.

According to the embodiment of the present invention, the ceramic body 10 may have the first and second main surfaces facing each other in the thickness direction, the first and second side surfaces facing each other in the width direction, and the first and second end surfaces facing each other in the length direction. Here, the first and second main surfaces refer to upper and lower surfaces of the ceramic body 10.

According to the embodiment of the invention, a raw material forming the dielectric layers 11 is not particularly limited as long as sufficient capacitance may be obtained, but may be, for example, a barium titanate ($BaTiO_3$) powder.

As a material forming the dielectric layer 11, various ceramic additives, organic solvents, plasticizers, binders, dispersing agents, and the like, may be added to powder such as barium titanate ($BaTiO_3$) powder and the like.

An average particle diameter of the ceramic powder used to form the dielectric layer 11 is not particularly limited, but may be adjusted to satisfy desired dielectric properties. For example, an average particle diameter of the ceramic powder may be adjusted to be equal to or less than 400 nm.

A material for the first and second internal electrodes 21 and 22 is not particularly limited, but may be a conductive paste formed of, for example, precious metals such as palladium (Pd), a palladium-silver (Pd—Ag) alloy, and the like, and at least one of nickel (Ni) and copper (Cu).

According to the embodiment of the invention, the first and second external electrodes 31 and 32 may be formed on both end portions of the ceramic body 10.

The first external electrode 31 may include the first base electrode 31a electrically connected to the first internal electrode 21 and the first terminal electrode 31b formed on a portion of the first base electrode 31a formed on at least one of the first and second main surfaces of the ceramic body 10.

Further, the second external electrode 32 may include the second base electrode 32a electrically connected to the second internal electrode 22 and the second terminal electrode 32b formed on a portion of the second base electrode 32a formed on at least one of the first and second main surfaces of the ceramic body 10.

Hereinafter, a structure of the first and second external electrodes 31 and 32 will be described in more detail.

The first and second base electrodes 31a and 32a may be formed of a first conductive metal and glass.

For the formation of capacitance, the first and second external electrodes 31 and 32 may be formed on both end portions of the ceramic body 10, and the first and second base electrodes 31a and 32a included in the first and second external electrodes 31 and 32 may be electrically connected to the first and second internal electrodes 21 and 22.

The first and second base electrodes 31a and 32a may be formed of the same conductive material as the first and second internal electrodes 21 and 22, but are not limited thereto. For example, the first and second base electrodes 31a and 32a may be formed of at least one first conductive metal selected from a group consisting of copper (Cu), silver (Ag), nickel (Ni), and alloys thereof.

The first and second base electrodes 31a and 32a may be formed by applying and sintering a conductive paste prepared by adding a glass frit to the first conductive metal powder.

According to the embodiment of the invention, the first and second external electrodes 31 and 32 may be formed on the first and second base electrodes 31a and 32a, and may include the first and second terminal electrodes 31b and 32b formed on at least one of the first and second main surfaces of the ceramic body 10.

The first and second terminal electrodes 31b and 32b may be formed of a conductive paste including a second conductive metal.

The second conductive metal is not particularly limited, but may be, for example, copper (Cu).

Generally, a multilayer ceramic capacitor is mounted on a printed circuit board, and a nickel/tin plating layer is usually formed on an external electrode.

However, the multilayer ceramic capacitor according to the embodiment of the invention is not mounted on the printed circuit board, but is embedded in the board, and thus, the first and second external electrodes 31 and 32 of the multilayer ceramic capacitor are electrically connected to circuits of the board through vias formed of a copper (Cu) material.

Therefore, according to the embodiment of the invention, the first and second terminal electrodes 31b and 32b may be formed of copper (Cu) having good electrical connectivity with respect to the copper (Cu) material forming the vias in the board.

Meanwhile, since the first and second base electrodes 31a and 32a are formed of copper (Cu) as a main component but also include glass, the glass component absorbs laser during laser processing for forming the vias in the board, and thus, it may be difficult to adjust depths of the vias.

For this reason, the copper (Cu) plating layer has been separately formed on the external electrode of the embedded multilayer ceramic electronic part.

However, due to the separately formed copper (Cu) plating layer, the manufacturing costs may be increased, and due to the permeation of a plating solution into the ceramic body, reliability may be degraded.

Therefore, according to the embodiment of the invention, the above problems may be solved by forming the first and second terminal electrodes 31b and 32b, which are conductive paste layers formed of copper (Cu), on the first and second base electrodes 31a and 32a.

In detail, the first and second terminal electrodes 31b and 32b may be formed by applying a conductive paste including copper (Cu) without a glass frit therein to the first and second base electrodes 31a and 32a.

That is, the first and second terminal electrodes 31b and 32b after being sintered may be formed of copper (Cu), the second conductive metal.

Therefore, according to the embodiment of the invention, the copper plating layer is not formed on the first and second base electrodes 31a and 32a, but the conductive paste layer may be formed by applying and sintering the conductive paste including copper (Cu).

Since the plating layer is not formed on the first and second base electrodes 31a and 32a, an increase in costs due to the plating process and degradation in reliability due to the permeation of the plating solution into the ceramic body may be prevented.

Further, since the first and second terminal electrodes 31b and 32b after being sintered are formed of the second conductive metal, copper (Cu) and do not include the glass frit, difficulties in adjusting the depths of the vias due to the glass component absorbing the laser during laser processing for forming the vias in the board may be avoided.

Referring to FIG. 2, the first and second terminal electrodes 31b and 32b of the multilayer ceramic electronic part according to the embodiment of the invention may be formed on at least one of the first and second main surfaces of the ceramic body 10.

FIG. 2 illustrates that the first and second terminal electrodes 31b and 32b are only formed on the first main surface of the ceramic body 10.

The first main surface refers to an upper surface of the ceramic body 10 and corresponds to a surface of the ceramic body 10 connected to the vias of the printed circuit board.

Referring to FIG. 3, the first and second terminal electrodes 31b and 32b of the multilayer ceramic electronic part according to another embodiment of the invention may be formed on the first and second main surfaces of the ceramic body 10.

As a result, both upper and lower surfaces of the embedded multilayer ceramic electronic part may be connected to conductive patterns within the printed circuit board through the conductive vias.

A detailed description thereof will be provided below.

According to the embodiment of the invention, the first and second terminal electrodes 31b and 32b may be formed to be spaced apart from edges of the first and second base electrodes 31a and 32a in a length direction of the ceramic body by a predetermined interval.

The first and second terminal electrodes 31b and 32b may be formed using the conductive paste including copper (Cu). The method of forming the first and second terminal electrodes 31b and 32b is not particularly limited. For example, a screen printing method may be used.

Figure 4:
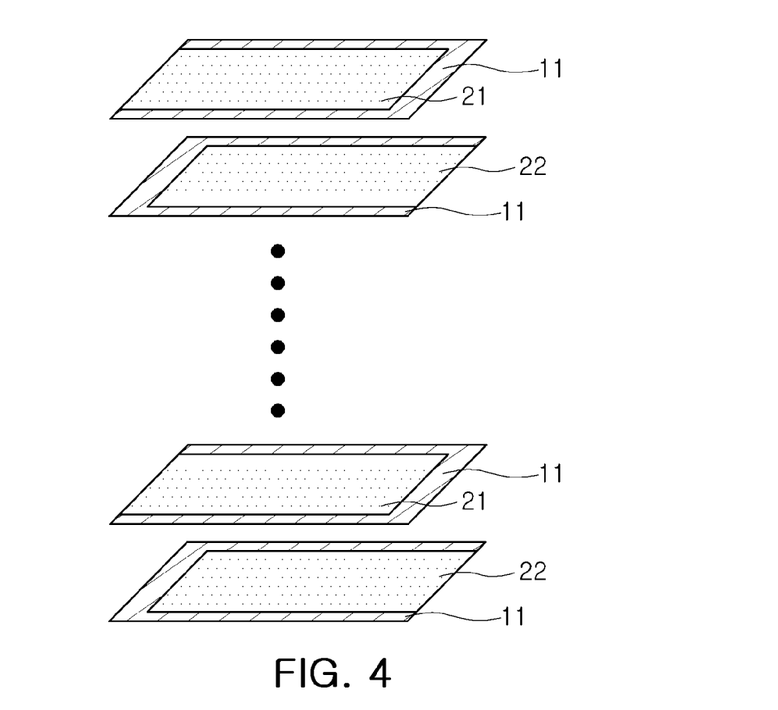
FIG. 4 is an exploded perspective view illustrating patterns of first and second internal electrodes according to an embodiment of the present invention.

FIG. 4 is an exploded perspective view illustrating patterns of first and second internal electrodes according to an embodiment of the present invention.

Figure 5:
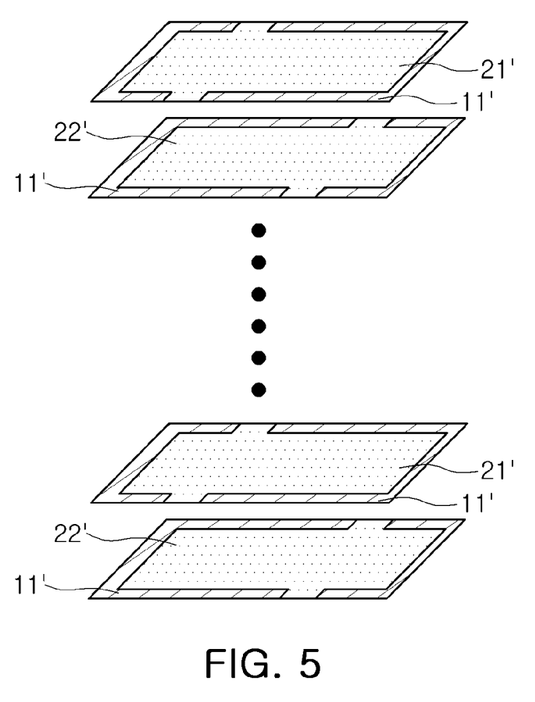
FIG. 5 is an exploded perspective view illustrating patterns of first and second internal electrodes according to another embodiment of the present invention.

FIG. 5 is an exploded perspective view illustrating patterns of first and second internal electrodes according to another embodiment of the present invention.

Hereinafter, a method of manufacturing a multilayer ceramic electronic part to be embedded in a board according to an embodiment of the invention will be described, but the invention is not limited thereto.

In the method of manufacturing a multilayer ceramic electronic part to be embedded in a board according to the embodiment of the invention, a plurality of ceramic green sheets may first be prepared by applying slurry including a barium titanate ($BaTiO_3$) powder and the like to carrier films and drying the same, thereby forming dielectric layers.

The slurry may be prepared by mixing a ceramic powder, a binder, and a solvent, and the slurry may be used to form the ceramic green sheet having a thickness of several μm by a doctor blade method.

Next, a conductive paste for internal electrodes may be prepared to include 40 to 50 parts by weight of a nickel powder having a nickel particle average size of 0.1 to 0.2 μm.

The conductive paste for internal electrodes may be applied to the green sheets by a screen printing method to thereby form internal electrodes, and then the green sheets having the internal electrodes formed thereon may be stacked in an amount of 400 to 500 layers, whereby the ceramic body 10 may be manufactured.

Referring to FIG. 4, in the multilayer ceramic capacitor according to the embodiment of the invention, the first and second internal electrodes 21 and 22 may be exposed to both end portions of the ceramic body 10, respectively.

Referring to FIG. 5, in the multilayer ceramic capacitor according to another embodiment of the present invention, first and second internal electrodes 21' and 22' may be formed to have leads exposed to both side surfaces of the ceramic body 10, respectively.

In this case, the first and second internal electrodes 21' and 22' may be formed on dielectric layers 11', while being spaced apart from both end surfaces of the ceramic body 10 by a predetermined distance.

As described above, the first and second internal electrodes 21' and 22' are formed to be spaced apart from both end surfaces of the ceramic body 10 by a predetermined distance, whereby degradation in reliability due to a reduction in moisture resistance and the like may be prevented.

Next, first and second base electrodes including a first conductive metal and glass may be formed on end portions of the ceramic body 10.

The first conductive metal is not particularly limited. For example, the first conductive metal may be at least one selected from a group consisting of copper (Cu), silver (Ag), nickel (Ni), and alloys thereof.

The glass is not particularly limited, but a material having the same composition as that of glass used to manufacture external electrodes of a general multilayer ceramic capacitor may be used.

The first and second base electrodes are formed on the end portions of the ceramic body, and thus may be electrically connected to the first and second internal electrodes, respectively.

Next, conductive paste layers including a second conductive metal may be formed on portions of the first and second base electrodes formed on at least one of the first and second main surfaces of the ceramic body 10.

The second conductive metal is not particularly limited, but may be, for example, copper (Cu).

The conductive paste layers may be formed as the first and second terminal electrodes after being sintered.

According to the embodiment of the invention, the conductive paste layers formed of the second conductive metal may be formed, unlike forming plating layers on first and second external electrodes at the time of manufacturing a general multilayer ceramic capacitor to be embedded in a board.

That is, the first and second terminal electrodes formed as the conductive paste layers are not formed by the plating process, but may be formed by applying the conductive paste including the second conductive metal to the first and second base electrodes. Here, the first and second terminal electrodes may be formed on at least one of the first and second main surfaces of the ceramic body 10.

As a result, since the plating layer is not formed on the first and second base electrodes 31a and 32a, an increase in costs due to the plating process and degradation in reliability due to the permeation of a plating solution into the ceramic body may be prevented.

Further, since the first and second terminal electrodes 31b and 32b after being sintered are formed of the second conductive metal, copper (Cu), and do not include the glass frit, difficulties in adjusting the depths of the vias due to the glass component absorbing laser during laser processing for forming the vias in the board may be avoided.

Further, details overlapped with the features of the multilayer ceramic electronic part according to the above-described embodiment of the invention will be omitted.

Figure 6:
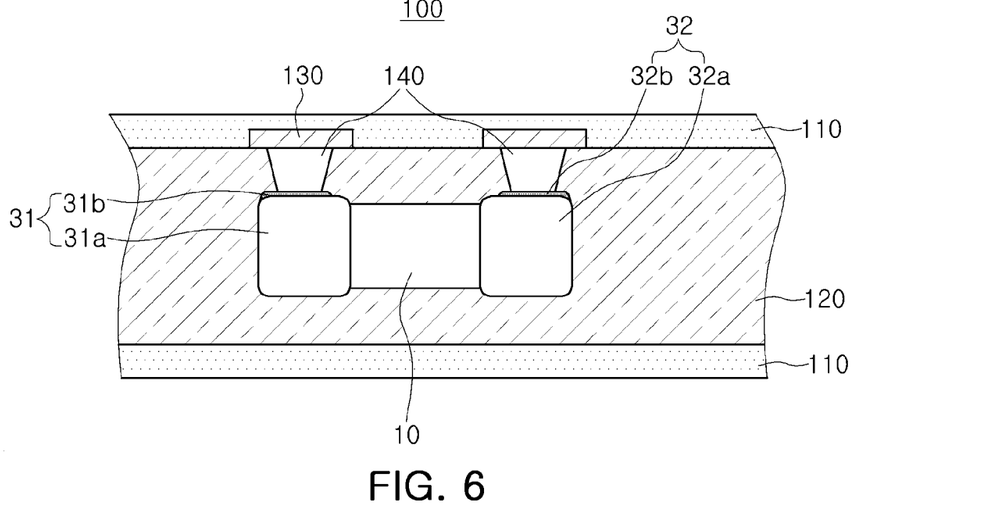
FIG. 6 is a cross-sectional view illustrating a printed circuit board having a multilayer ceramic electronic part embedded therein according to an embodiment of the present invention.

FIG. 6 is a cross-sectional view illustrating a printed circuit board having a multilayer ceramic electronic part embedded therein according to an embodiment of the present invention.

Figure 7:
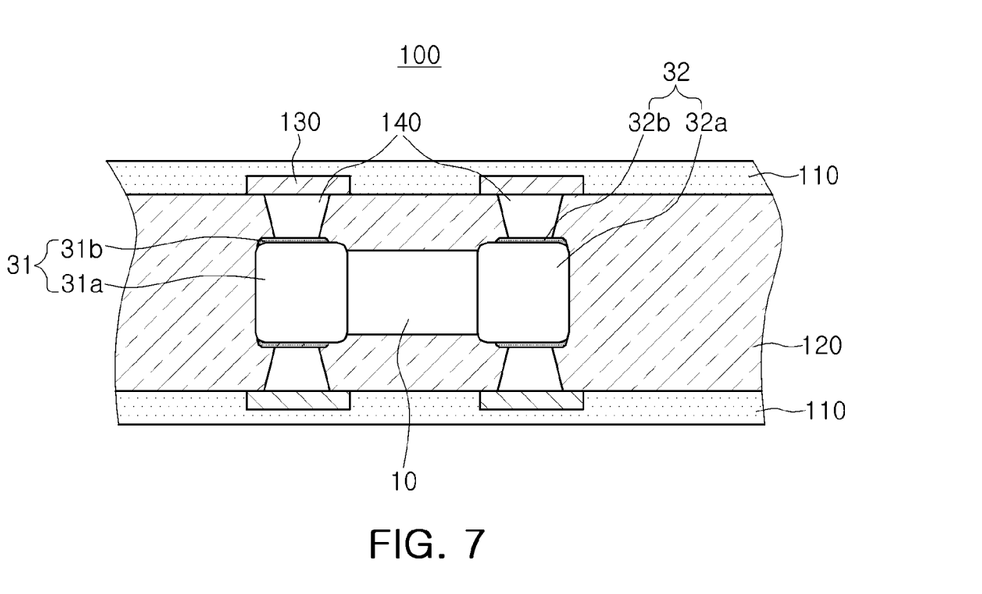
FIG. 7 is a cross-sectional view illustrating a printed circuit board having a multilayer ceramic electronic part embedded therein according to another embodiment of the present invention.

FIG. 7 is a cross-sectional view illustrating a printed circuit board having a multilayer ceramic electronic part embedded therein according to another embodiment of the present invention.

Referring to FIG. 6, a printed circuit board 100 having a multilayer ceramic electronic part embedded therein according to the embodiment of the present invention may include: an insulating substrate 110; and the multilayer ceramic electronic part including the ceramic body 10 including dielectric layers 11, first and second main surfaces facing each other, first and second side surfaces facing each other, and first and second end surfaces facing each other; first and second internal electrodes 21 and 22 alternately exposed through the end surfaces of the ceramic body 10, having the dielectric layer disposed therebetween; and first and second external electrodes 31 and 32 formed on both end portions of the ceramic body 10, in which the first external electrode 31 includes a first base electrode 31a electrically connected to the first internal electrode 21 and a first terminal electrode 31b formed on a portion of the first base electrode 31a formed on at least one of the first and second main surfaces of the ceramic body 10, the second external electrode 32 includes a second base electrode 32a electrically connected to the second internal electrode 22 and a second terminal electrode 32b formed on a portion of the second base electrode 32a formed on at least one of the first and second main surfaces of the ceramic body 10, the first and second base electrodes 31a and 32a are formed of a first conductive metal and glass, and the first and second terminal electrodes 31b and 32b are formed of a second conductive metal.

The insulating substrate 110 may include an insulating layer 120, and as needed, may include conductive patterns 130 and conductive via holes 140 configuring various types of interlayer circuits as illustrated in FIG. 6. The insulating substrate 110 may be the printed circuit board 100 in which the multilayer ceramic electronic part is provided therein.

The multilayer ceramic electronic part is inserted into the printed circuit board 100, and then may suffer from several harsh conditions during post-processing, such as heat treatment of the printed circuit board 100 and the like.

In particular, the contraction and expansion of the printed circuit board 100 during the heat treatment process directly affect to the multilayer ceramic electronic part inserted into the printed circuit board 100, such that stress may be applied to a bonding surface between the multilayer ceramic electronic part and the printed circuit board 100.

When the stress applied to the bonding surface between the multilayer ceramic electronic part and the printed circuit board 100 is higher than bonding strength, delamination caused by the separation of the bonding surface may occur.

The bonding strength between the multilayer ceramic electronic part and the printed circuit board 100 is in proportion to electrochemical adhesion between the multilayer ceramic electronic part and the printed circuit board 100 and an effective surface area of the bonding surface between the multilayer ceramic electronic part and the printed circuit board 100. In order to improve the effective surface area of the bonding surface, surface roughness of the multilayer ceramic electronic part may be controlled so that the delamination between the multilayer ceramic electronic part and the printed circuit board 100 may be prevented.

Further, a delamination occurrence frequency of the bonding surface between the multilayer ceramic electronic part and the printed circuit board 100 may be measured according to the surface roughness of the embedded multilayer ceramic electronic part.

Referring to FIG. 7, in the printed circuit board 100 having the multilayer ceramic electronic part embedded therein according to another embodiment of the invention, the first and second terminal electrodes 31b and 32b of the embedded multilayer ceramic electronic part may be formed on the first and second main surfaces of the ceramic body 10.

In this case, the conductive patterns 130 on the insulating layer 120 within the printed circuit board may be formed above and below the multilayer ceramic electronic part, and the conductive patterns and the multilayer ceramic electronic part may be connected to one another through the conductive via holes 140.

Other features of the printed circuit board according to this embodiment are the same as those of the printed circuit board according to the above-described embodiment of the invention, and therefore, detailed descriptions thereof will be omitted.

As set forth above, according to embodiments of the invention, a conductive paste layer containing copper (Cu) may be formed on external electrodes of a multilayer ceramic electronic part embedded in a board and formed on at least one of upper and lower surfaces of a ceramic body, instead of forming a plating layer, whereby problems that may be caused during laser processing for forming via holes in the board and degradation in reliability due to the permeation of a plating solution can be prevented. In addition, manufacturing costs can be reduced by omitting the plating process.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic electronic part to be embedded in a board, comprising:
  a ceramic body including dielectric layers and having first and second main surfaces facing each other, first and second side surfaces facing each other, and first and second end surfaces facing each other;
  first and second internal electrodes alternately exposed through the end surfaces of the ceramic body, having the dielectric layer disposed therebetween; and
  first and second external electrodes formed on both end portions of the ceramic body,
  wherein the first external electrode has a two layer structure consisting of:
  a first base electrode electrically connected to the first internal electrode and formed on the first end surface and at least one of the first and second main surfaces of the ceramic body, and
  a first terminal electrode formed on a portion of the first base electrode and formed only on at least one of the first and second main surfaces of the ceramic body,
  wherein the second external electrode has a two layer structure consisting of:
  a second base electrode electrically connected to the second internal electrode and formed on the second end surface and at least one of the first and second main surfaces of the ceramic body, and
  a second terminal electrode formed on a portion of the second base electrode and formed only on at least one of the first and second main surfaces of the ceramic body,
  the first and second base electrodes are formed of a first conductive metal and glass, and
  the first and second terminal electrodes are formed of a second conductive metal not containing glass.

2. The multilayer ceramic electronic part of claim 1, wherein the first conductive metal is at least one selected from a group consisting of copper (Cu), silver (Ag), nickel (Ni), and alloys thereof.

3. The multilayer ceramic electronic part of claim 1, wherein the second conductive metal is copper (Cu).

4. A multilayer ceramic electronic part to be embedded in a board, comprising:
a ceramic body including dielectric layers and having first and second main surfaces facing each other, first and second side surfaces facing each other, and first and second end surfaces facing each other;
first and second internal electrodes laminated in the ceramic body with the dielectric layer disposed therebetween, being spaced apart from the end surfaces of the ceramic body by a predetermined distance, and having a lead exposed to at least one of the first and second side surfaces of the ceramic body; and
first and second external electrodes formed on both end portions of the ceramic body,
wherein the first external electrode has a two layer structure consisting of:
a first base electrode electrically connected to the first internal electrode and formed on the first end surface and at least one of the first and second main surfaces of the ceramic body, and
a first terminal electrode formed on a portion of the first base electrode and formed only on at least one of the first and second main surfaces of the ceramic body,
wherein the second external electrode has a two layer structure consisting of:
a second base electrode electrically connected to the second internal electrode and formed on the second end surface and at least one of the first and second main surfaces of the ceramic body, and
a second terminal electrode formed on a portion of the second base electrode and formed only on at least one of the first and second main surfaces of the ceramic body,
the first and second base electrodes are formed of a first conductive metal and glass, and
the first and second terminal electrodes are formed of a second conductive metal not containing glass.

5. The multilayer ceramic electronic part of claim 4, wherein the first conductive metal is at least one selected from a group consisting of copper (Cu), silver (Ag), nickel (Ni), and alloys thereof.

6. The multilayer ceramic electronic part of claim 4, wherein the second conductive metal is copper (Cu).

7. A printed circuit board having a multilayer ceramic electronic part embedded therein, the printed circuit board comprising:
an insulating substrate; and
the multilayer ceramic electronic part including a ceramic body including dielectric layers and having first and second main surfaces facing each other, first and second side surfaces facing each other and first and second end surfaces facing each other, first and second internal electrodes alternately exposed through both end surfaces of the ceramic body, having the dielectric layer disposed therebetween, and first and second external electrodes formed on both end portions of the ceramic body,
wherein the first external electrode has a two layer structure consisting of:
a first base electrode electrically connected to the first internal electrode and formed on the first end surface and at least one of the first and second main surfaces of the ceramic body, and
a first terminal electrode formed on a portion of the first base electrode and formed only on at least one of the first and second main surfaces of the ceramic body,
wherein the second external electrode has a two layer structure consisting of:
a second base electrode electrically connected to the second internal electrode and formed on the second end surface and at least one of the first and second main surfaces of the ceramic body, and
a second terminal electrode formed on a portion of the second base electrode and formed only on at least one of the first and second main surfaces of the ceramic body,
the first and second base electrodes are formed of a first conductive metal and glass, and
the first and second terminal electrodes are formed of a second conductive metal not containing glass.

8. The printed circuit board of claim 7, wherein the first conductive metal is at least one selected from a group consisting of copper (Cu), silver (Ag), nickel (Ni), and alloys thereof.

9. The printed circuit board of claim 7, wherein the second conductive metal is copper (Cu).

* * * * *